United States Patent [19]

Kawamura et al.

[11] Patent Number: 5,061,605
[45] Date of Patent: Oct. 29, 1991

[54] PHOTOPOLYMERIZABLE COMPOSITION CONTAINING PHOTOINITIATORS HAVING AT LEAST TWO SULFUR ATOMS

[75] Inventors: Kouichi Kawamura; Mitsumasa Tsuchiya, both of Shizuoka, Japan

[73] Assignee: Fuji Photo Film Co., Ltd., Minami-Ashigara, Japan

[21] Appl. No.: 686,143

[22] Filed: Apr. 16, 1991

[30] Foreign Application Priority Data

Apr. 17, 1990 [JP] Japan .................. 2-100885

[51] Int. Cl.$^5$ ............................... G03C 1/68
[52] U.S. Cl. .................. 430/281; 430/922; 430/921; 522/34; 522/50; 522/53; 522/54
[58] Field of Search ............ 430/281, 921, 922; 522/34, 50, 52, 54

[56] References Cited

U.S. PATENT DOCUMENTS

| | | | |
|---|---|---|---|
| 4,504,573 | 3/1985 | Ishikawa et al. | 430/921 |
| 4,636,459 | 1/1987 | Kawamura et al. | |
| 4,684,671 | 8/1982 | Tsuchiya et al. | 430/921 |

*Primary Examiner*—Jack P. Brammer
*Attorney, Agent, or Firm*—Burns, Doane, Swecker & Mathis

[57] ABSTRACT

A photopolymerizable composition comprises an addition polymerizable compound having at least one ethylenically unsaturated double bond and a photopolymerization initiator, wherein it comprises a compound represented by the following general formula (I) as the photopolymerization initiator:

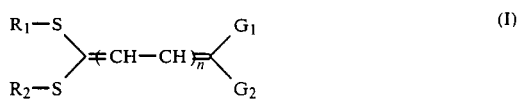

(wherein $R_1$ and $R_2$ may be the same or different and each independently represents a substituted or unsubstituted alkyl, aryl or alkenyl group or $R_1$ and $R_2$ may form a non-metallic ring together with the sulfur atoms to which they are bonded; n is 0, 1 or 2; $G_1$ and $G_2$ may be the same or different and each represents a hydrogen atom, a cyano group or a substituted or unsubstituted alkoxycarbonyl, aryloxycarbonyl, acyl, arylcarbonyl, alkylthio, arylthio, alkylsulfonyl, arylsulfonyl or fluoroalkylsulfonyl group, provided that $G_1$ and $G_2$ do not simultaneously represent hydrogen atoms or $G_1$ and $G_2$ may form a non-metallic ring together with the carbon atom to which they are bonded). The photopolymerizable composition is improved in the sensitivity to the light rays having strong emission spectra at the long wavelength range and can be used in making, for instance, paints, printing inks and printing materials such as letterpress and lithographic printing materials.

20 Claims, No Drawings

PHOTOPOLYMERIZABLE COMPOSITION CONTAINING PHOTOINITIATORS HAVING AT LEAST TWO SULFUR ATOMS

BACKGROUND OF THE INVENTION

The present invention relates to a photopolymerizable composition for use in making, for instance, paints, printing inks and printing materials such as letterpress and lithographic printing materials.

There have been known a variety of polymerization initiators for monomers which have a radical-polymerizable ethylenically unsaturated bond capable of generating a radical through the irradiation with Uv rays and in particular, benzophenones, Michler's ketones, fluorenones, xanthones, thioxanthones or the like have been well known.

However, if these compounds are used in the photopolymerizable compositions as photopolymerization initiators, they are not sufficiently sensitive to light rays from a light source which shows a strong emission spectra at the long wavelength range such as a metal halide lamp because of the structures of these compounds In addition, in a system to which a pigment such as titanium oxide is added, the absorption spectra of the pigment are superimposed with those of the photopolymerization initiator. Therefore, the quantity of light rays having a desired wavelength required for the photopolymerization initiator to cause a desired polymerization is reduced and hence only insufficient sensitivity of the initiator can be attained.

Verious methods have been proposed for solving the foregoing problem. For instance, Japanese Patent Unexamined Publication (hereinafter referred to as "J.P. KOKAI") No. Sho 61-145203 discloses that a certain kind of halogen-substituted acridone compound has an improved high sensitivity to the foregoing light rays of long wavelengths. These compounds can certainly show high sensitivity, but it is still insufficient from the practical viewpoint and thus there has been desired for the development of a photopolymerization initiator having higher sensitivity.

SUMMARY OF THE INVENTION

Accordingly, an object of the present invention is to provide a photopolymerizable composition which is improved in the sensitivity to the light rays from the foregoing light sources having strong emission spectra falling within the long wavelength range.

The inventors of this invention have conducted intensive studies to accomplish the foregoing object, have found out that merocyanine dyes having specific structures show high sensitivity to light rays of long wavelengths, are not greatly affected by the presence of a pigment such as titanium oxide and serve as photopolymerization initiators having good storage stability and thus have completed the present invention.

Consequently, the present invention relates to a photopolymrizable composition which comprises a compound having at least one ethylenically unsaturated double bond and a photopolymerization initiator represented by the following general formula (I):

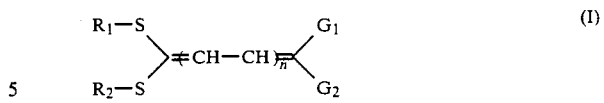

(wherein $R_1$ and $R_2$ each independently represents a substituted or unsubstituted alkyl, aryl or alkenyl group or $R_1$ and $R_2$ may form a ring comprising non-metallic elements together with the sulfur atoms to which they are bonded respectively; n represents 0, 1 or 2; $G_1$ and $G_2$ may be the same or different and each represents a hydrogen atom, a cyano group, or substituted or unsubstituted alkoxycarbonyl, aryloxycarbonyl, acyl, arylcarbonyl, alkylthio, arylthio, alkylsulfonyl, arylsulfonyl or fluoroalkylsulfonyl group, provided that $G_1$ and $G_2$ do not simultaneously represent hydrogen atoms or $G_1$ and $G_2$ may form a ring comprising non-metallic elements together with the carbon atom to which they are bonded).

DESCRIPTION OF THE PREFERRED EMBODIMENTS

The present invention will hereunder be explained in more detail.

The addition polymerizable compounds having an ethylenically unsaturated double bond which are used in the present invention are those having at least one ethylenically unsaturated double bond in the chemical structure and they may be any monomers, prepolymers (i.e., dimers, trimers, other oligomers or mixture thereof), or copolymers thereof so far as they are known compounds having a boiling point of not less than 100° C. and an acryloyl or methacryloyl group. Typical examples thereof are as follows:

(1) Acrylates or methacrylates of the following alcohols such as methanol, ethanol, propanol, hexanol, octanol, cyclohexanol, ethylene glycol, propylene glycol, diethylene glycol, triethylene glycol, tetraethylene glycol, polyethylene glycol, glycerin, trimethylolpropane and pentaerythritol.

(2) Reaction products of the following amines or carboxylic acids with glycidyl acrylates or glycidyl methacrylates, for instance, amines such as methylamine, ethylamine, butylamine, benzylamine, ethylenediamine, diethylenetriamine, hexamethylenediamine, p-xylylenediamine, m-xylylenediamine, ethanolamine, dimethylamine and aniline; and carboxylic acids such as acetic acid, propionic acid, benzoic acid, acrylic acid, methacrylic acid, succinic acid, maleic acid, phthalic acid, tartaric acid and citric acid.

(3) Amide derivatives such as acrylamide, methacrylamide, N-methylolacrylamide, methylenebisacrylamide and diacetone-acrylamide.

(4) Reaction products of epoxy compounds with acrylic acid or methacrylic acid.

(5) Reaction products of isocyanate-containing compounds with β-hydroxyethyl acrylate or β-hydroxyethyl methacrylate.

These compounds may be used alone or in combination.

The photopolymerization initiators used in the present invention are, as has already been described above, represented by the following general formula (I):

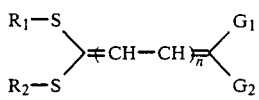
  (I)

In the general formula (I), if $R_1$ and $R_2$ each represents an alkyl group, the alkyl group is preferably those having 1 to 10 carbon atoms such as methyl and ethyl groups, the alkyl group may be substituted with, for instance, a hydroxyl group, a cyano group, an alkoxy group such as a methoxy or ethoxy group, a halogen atom such as a chlorine or bromine atom, a carboxyl group, a carboalkoxy group, a sulfonyl group, an aryl group such as a phenyl or p-nitrophenyl group, a vinyl group, a methylvinyl group and a cinnamyl group.

If $R_1$ and $R_2$ each represents an aryl group, the aryl group is preferably a phenyl or naphthyl group. The aryl group may be substituted with a substituent selected from the group consisting of, for instance, alkyl groups having 1 to 10 carbon atoms, hydroxyl group, cyano groups, alkoxy groups having 1 to 10 carbon atoms such as methoxy and ethoxy groups, halogen atoms such as chlorine and bromine atoms, carboxyl groups, carboalkoxy groups and sulfonyl groups.

If $R_1$ and $R_2$ each represents an alkenyl group, it is preferably a vinyl group and it may be substituted with a substituent selected from the group consisting of, for instance, alkyl groups having 1 to 10 carbon atoms and aryl groups having 6 to 18 carbon atoms. These substituents may also be substituted with an alkyl group having 1 to 10 carbon atoms such as methyl group.

$R_1$ and $R_2$ may form a ring comprising non-metallic elements together with the sulfur atoms to which they are bonded and examples of such rings are 5-membered or 6-membered rings or 5-membered or 6-membered rings obtained by condensing aromatic rings. Moreover, these rings may have substituents selected from the group consisting of, for instance, alkyl groups, aryl groups, substituted alkyl and aryl groups, hydroxyl group, cyano groups, alkoxy groups, halogen atoms, carboxyl groups, carboalkoxy groups and sulfonyl groups.

The preferred alkyl moieties in the alkoxycarbonyl, acyl, alkylthio, alkylsulfonyl or fluoroalkylsulfonyl groups in the foregoing $G_1$ and $G_2$ are alkyl groups having 1 to 10 carbon atoms and aryl moieties of the aryloxycarbonyl, arylcarbonyl, arylthio, arylsulfonyl in $G_1$ and $G_2$ are preferably phenyl and naphthyl groups. These alkyl and aryl moieties may be substituted with, for instance, at least one member selected from the group consisting of alkyl groups having 1 to 10 carbon atoms, hydroxyl group, cyano groups, alkoxy groups having 1 to 10 carbon atoms, halogen atoms, carboxyl groups, carboalkoxy groups, sulfonyl groups, sulfoalkoxy groups, aryl groups having 6 to 18 carbon atoms, acyl groups, vinyl group and cinnamyl group.

The rings comprising non-metal elements, formed from $G_1$ and $G_2$ together with the carbon atom to which they are bonded, are those generally used as acidic nuclei in merocyanine dyes and include, for instance, the following nuclei:

(a) 1,3-dicarbonyl nuclei such as 1,3-indanedione, 1,3cyclohexanedione, 5,5-dimethyl-1,3-cyclohexanedione and 1,3-dioxane-4,6-dione;

(b) pyrazolinone nuclei such as 3-methyl-1-phenyl-2-pyrazolin-5-one, 1-phenyl-2-pyrazolin-5-one and 1-(2-benzothiazolyl)-3-methyl-2-pyrazolin-5-one;

(c) isooxazolinone nuclei such as 3-phenyl-2-isooxazolin-5-one and 3-methyl-2-isooxazolin-5-one;

(d) oxyindole nuclei such as 1-alkyl-2,3-dihydro-2-oxyindole;

(e) 2,4,6-triketohexahydropyrimidine nuclei such as barbituric acid or 2-thiobarbituric acid and derivatives thereof which include, for instance, 1-alkyl derivatives such as 1-methyl and 1-ethyl derivatives; 1,3-dialkyl derivatives such as 1,3-diethyl and 1,3-dibutyl derivatives; 1,3-diaryl derivatives such as 1,3-diphenyl, 1,3-di-(p-chlorophenyl) and 1, 3-di-(p-ethoxycarbonylphenyl) derivatives and 1-alkyl-3-aryl derivatives such as 1-ethyl-3-phenyl derivatives;

(f) 2-thio-2,4-thiazolidinedione nuclei such as rhodanine and derivatives thereof which include, for instance, 3-alkylrhodanones such as 3-ethylrhodanine and 3-allylrhodanine, and 3-arylrhodanines such as 3-phenylrhodanine;

(g) 2-thio-2,4-oxazolidinedione (2-thio-2,4-(3H, 5H)-oxazoledione) nuclei such as 2-ethyl-2-thio- 2,4-oxazolidinedione;

(h) thianaphthenone nuclei such as 3(2H)-thianaphthenone and 3(2H)-thianaphthenone-1,1-dioxide;

(i) 2-thio-2,5-thiazolidinedione nuclei such as 3-ethyl-2-thio-2,5-thiazolidinedione (j) 2,4-thiazolidinedione nuclei such as 2,4-thiazolidinedione, 3-ethyl-2,4-thiazolidinedione, 3-ethyl-2,4-thiazolidinedione and 3-phenyl-2,4-thiazolidinedione;

(k) thiazolidinone nuclei such as 4-thiazolidinone and 3-ethyl-4-thiazolidinone;

(l) 4-thiazolinone nuclei such as 2-ethylmercapto-5-thiazolin-4-one and 2-alkylphenylamino-5-thiazolin-4-one;

(m) 2-imino-2-oxozolin-4-one (pseudohydantoin) nuclei;

(n) 2,4-imidazolidinedione (hydantoin) nuclei such as 2,4-imidazolidinedione and 3-ethyl-2,4-imidazolidinedione;

(o) 2-thio-2,4-imidazolidinedione (2-thio-hydantoin) nuclei such as 2-thio-2,4-imidazolidinedione and 3-ethyl-2-thio-2,4-imidazolidinedione;

(p) 2-imidazolin-5-one nuclei such as 2-n-propyl-mercapto-2-imidazolin-5-one;

(q) furan-5-one nucleus;

(r) 4-hydroxy-2(1H)-quinolinone nuclei or 4-hydroxy-2(1H)-pyridinone nuclei such as N-methyl-4-hydroxy-2(1H)-quinolinone, N-n-butyl-4-hydroxy-2(1H)-quinolinone and N-methyl-4-hydroxy-2(1H)-pyridinone;

(s) substituted and unsubstituted 4-hydroxy-2H-pyran-2-one and 4-hydroxycoumarin nuclei;

(t) substituted and unsubstituted thioindoxyl nuclei such as 5-methylthioindoxyl.

Specific examples of the photopolymerization initiators represented by the general formula (I) which may be used in the present invention area as follows:

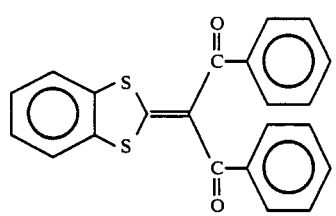

No. 1

-continued
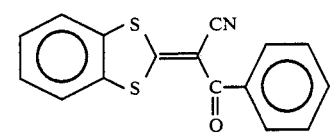 No.2
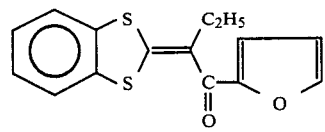 No. 3
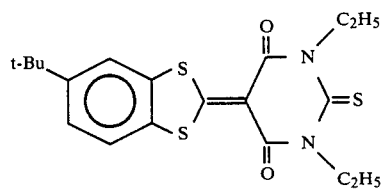 No. 4
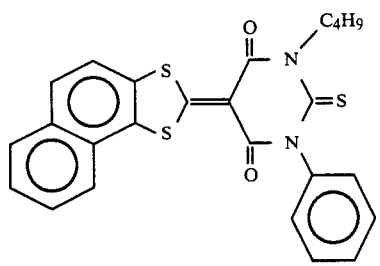 No. 5
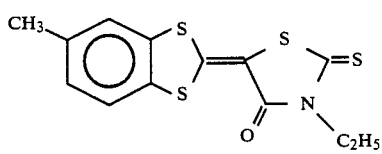 No 6
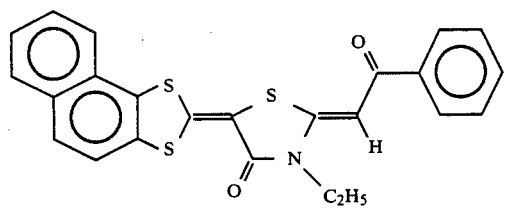 No. 7
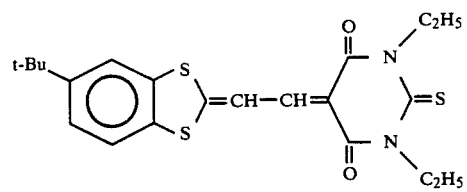 No. 8
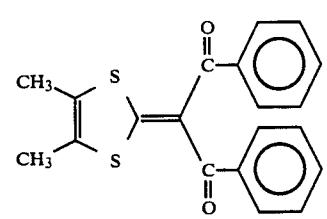 No. 9
-continued
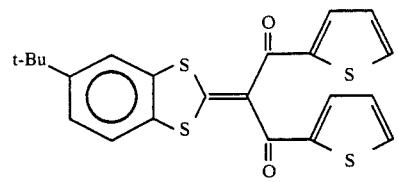 No. 10
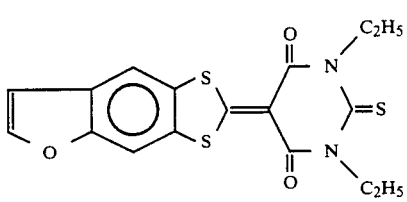 No. 11
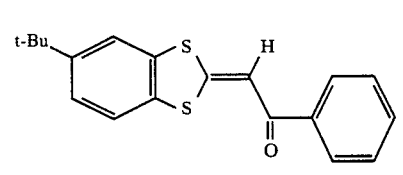 No. 12
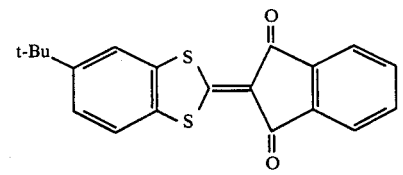 No. 13
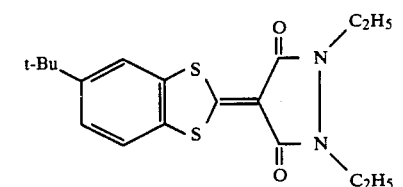 No. 14
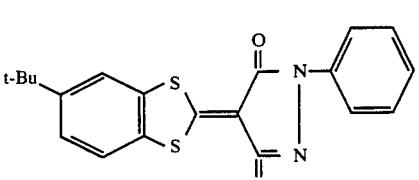 No. 15
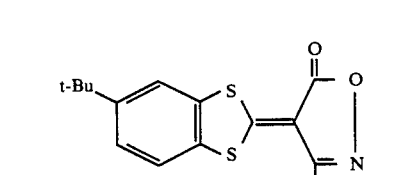 No. 16
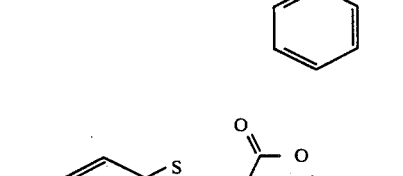 No. 17
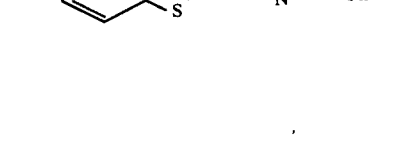

-continued

No. 18 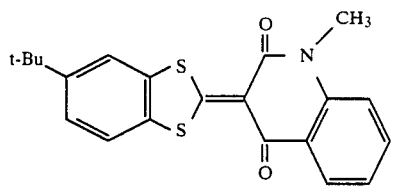

No. 19 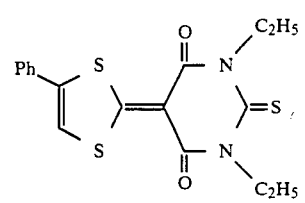

No. 20 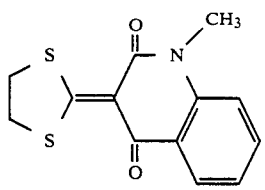

No. 21 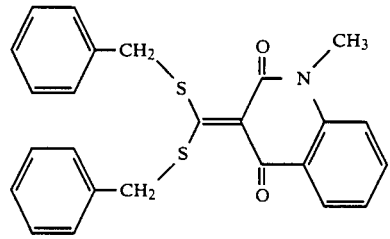

No. 22 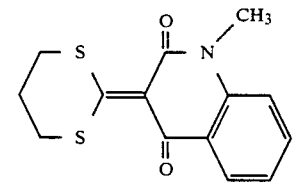

No. 23 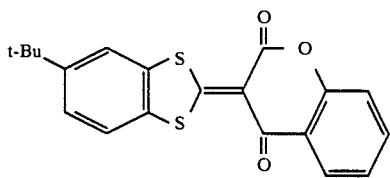

No. 24 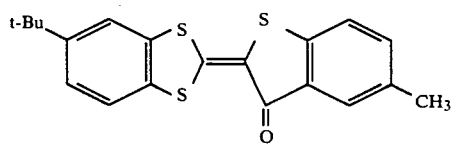

No. 25 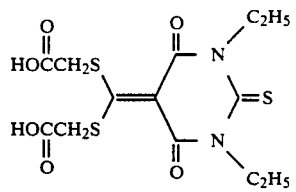

-continued

No. 26 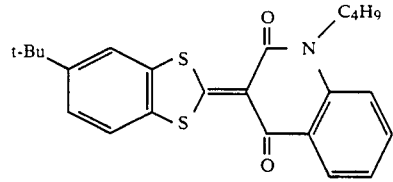

No. 27 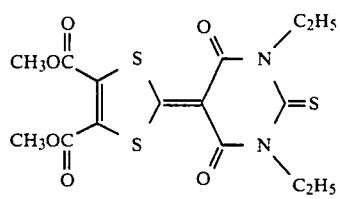

No. 28 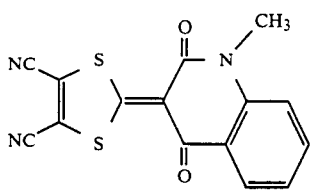

No. 29 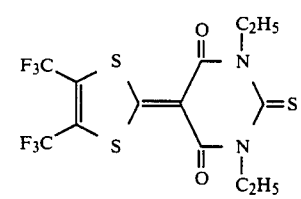

No. 30 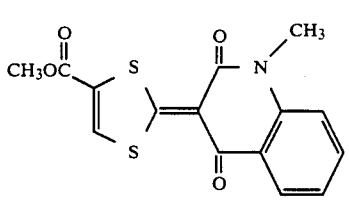

In the foregoing general formulae, "t-Bu" means a tertiary butyl group and "Ph" means a phenyl group.

The photopolymerization initiators used in the present invention may be prepared by, for instance, a method as will be detailed below.

When $R_1$ and $R_2$ do not form a ring or they form a saturated heterocyclic ring, the photopolymerization initiators of Formula (I) can be prepared according to the method as disclosed in Acta Chemica Scandinavica, KAI ARNE JENSEN and LARS HENRIKSEN 1968, 22, pp. 1107–1128. More specifically, these initiators can be prepared according to the following reaction scheme:

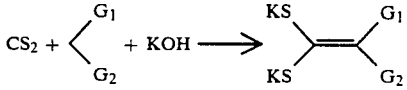

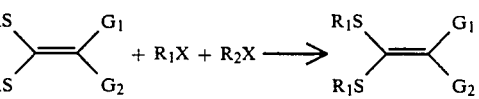

(wherein X represents a halogen atom).

In addition, the photopolymerization initiators in which $R_1$ and $R_2$ form an unsaturated heterocyclic ring, they can be prepared by the following method:

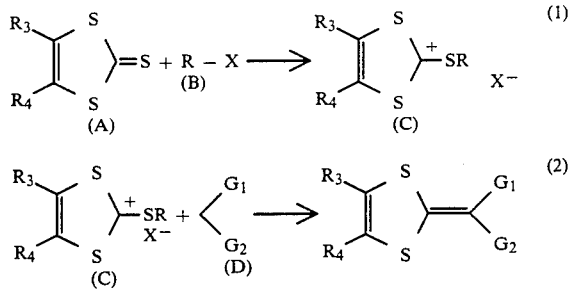

(wherein $R_3$ $R_4$ each independently represents a hydrogen or halogen atom or an alkyl, aryl, substituted alkyl, substituted aryl, hydroxyl, cyano, alkoxy, carboxyl or alkoxycarbonyl group or $R_3$ and $R_4$ may be bonded together to form a carbon ring or a condensed aromatic ring).

More specifically, they can prepared by subjecting a 1,3-dithiol-2-thione compound (A) to S-alkylation (C) (step 1) using a strong alkylating agent (B) such as an alkyl trifluoromethaneulfonate or trialkyloxonium fluoroborate and then reacting the resulting product with an active methylene-containing compound (D) such as thiobarbituric acid or dibenzoylmethane to perform a dealkylthio-reaction (step 2).

Moreover, the photopolymrization intiators of Formula (I) wherein n = 1, 2 can be prepared according to the method disclosed in F.M. Hamer et al;, "The Cyanine Dyes and Related Compounds" 1964, pp. 511–611 with a minor modification. More specifically, they can be obtained by reacting a compound represented by the following general formula (E) with a compound of Formula (D) in a proper solvent such as acetonitrile in the presence of a catalyst such as triethylamine.

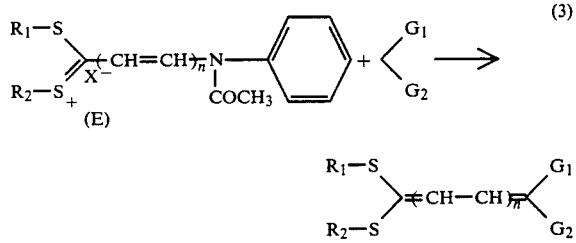

(wherein $X^-$ represents an anion such as $ClO_4^-$, n is an integer of 1 or 2 and $R_1$, $R_2$, $G_1$ and $G_2$ are the same as those defined above in connection with Formula (I)).

The photopolymerization initiators used in the present invention is used in the composition of the invention in an amount generally ranging from 0.5 to 50% by weight and preferably 1.0 to 20% by weight on the basis of the weight of the addition polymerizable compound used.

The photopolymerizable composition of the present invention may further comprise a sensitizer in addition to the photopolymerization initiator represented by Formula (I). In this case, the sensitizers are selected so that they can further improve the rate of the photopolymerization when they are used simultaneoulsy with the photopolymerization initiator. Examples of such sensitizers are benzophenone derivatives, benzanthrone derivatives, quinones, anthraquinones, aromatic nitro compounds, naphthothiazoline derivatives, benzothiazoline derivatives, xanthones, naphthothiazole derivatives, ketocoumarin compounds, benzothiazole derivatives, naphthofuranone compounds, benzoin compounds, acetophenone compounds, fluorenone compounds, pyrylium salts and thiapyrylium salts. Specific examples thereof include Michler's ketones, 4,4'-bis(diethylamino) benzophenone, benzanthrone, (3-methyl-1,3-diaza-1,9-benz) anthronepicramide, 5-nitroacenaphthene, 2-nitrofluorene, 2-dibenzoylmethylene-3-methylnaphthothiazoline, 3,3-caronyl-bis (7-diethylaminocoumarin), 2,4,6-triphenylthiapyrylium perchlorate, 2-(p-chlorobenzoyl)naphthothiazole, benzoin, benzoin methyl ether, benzoin ethyl ether, 2,2-dimethoxy-2phenylacetophenone, 9-fluorenone, 2-chloro-9-fluorenone, 2-methyl-9-fluorenone, 9,10-anthraquinone, 2-ethyl-9,10-anthraquinone, 2-t-butyl-9,10anthraquinone, 2,6-dichloro-9,10anthraquinone, xanthone, 2-methylxanthone, 2-methoxyxanthone dibenzalacetone, p-(dimethylamino)phenylstyryl ketone and p-(dimethylamino)phenyl-p-methylstyryl ketone.

Moreover, it is also preferred to use thioxanthone derivatives such as 2-chlorothioxanthone, 2-isopropylthioxanthone and dimethylthioxanthone; and substituted thioxanthones such as those disclosed in German Patent Nos. 3,018,891 and 3,117,568, European Patent No. 33,720 and U.K. Patent No. 2,075,506.

The photopolymerization initiators of Formula (I) may be used in combination in the presence of a certain kind of activating agent to further enhance the ability of photopolymerization initiation.

Examples of such activating agents which make it possible to further enhance the ability of the photopolymerization initiation of the photopolymerization initiators are as follows:

(1) Carbonyl compounds such as benzyl, benzoin, benzylketals and benzoin ethers.

As the benzylketals, there may be mentioned, for instance, dimethoxy-2-phenylacetophenone and other examples thereof are disclosed in J.P. KOKAI Nos. Sho 49-42653 and Sho 49-99147 and Japanese Patent Publication for Opposition Purpose (hereinafter referred to as "J.P. KOKOKU") No. Sho 50-29930. Examples of the benzoin ethers are O-methylbenzoin and O-ethylbenzoin and other examples thereof are disclosed in J. Amer. Chem. Soc., 1975, 97, p. 1519.

Other carbonyl compounds may also be used in the invention and examples thereof are acetophenone derivatives such as diethoxyacetophenone; compounds disclosed in European Patent No. 0125206A1 such as benzoyl-1-cyclohexanol; aromatic aliphatic ketones such as 2-morpholino-2-methyl-p-methylthiopropiophenone as disclosed in U.S. Pat. No. 4,318,791; and 2-hydroxyacetophenone derivatives such as 2-hydroxy-2-methyl-p-chloropropiophenone.

(2) Sulfonyloxime compounds

Examples thereof are those disclosed in J.P. KOKAI No. Sho 57-53747, German Patent (OLS) No. 3410387A1 and U.S. Pat. No. 4,258,121. Specific examples thereof include 2-phenyl-3-phenylsulfonyloxy-4(3H)-quinazolinone, 2-styryl-3-phenylsulfonyloxy-4(3H)-quinazolinone and N-hydroxy-1,8-naphthalimidobenzenesulfonic acid esters.

(3) Acyloxime compounds

Examples thereof are those disclosed in Progress in Organic Coatings, 1975, 3, p. 115 such as 1-phenyl-1,2-propanedione-2-(o-ethoxycarboxime).

(4) Hexaarylbiimidazole compounds

Specific examples of preferred hexaarylbiimidazoles include 2,2'-bis(o-chlorophenyl)-4,4',5,5'-tetraphenylbiimida-zole and 2,2'-bis(o,p-dichlorophenyl)-4,4'5,5'tetraphenylbiimidazole and other examples thereof are disclosed in J.P. KOKOKU No. Sho 45-37377.

(5) Halogen atom-containing compounds

Examples thereof are those disclosed in U.K. Patent Nos. 1, 234,648 and 2,039,073B; U.S. Pat. Nos. 3,827,596 and 3,905,813 and J.P. KOKAI Nos. Sho 55-24113 and Sho 58-15503. Typical examples thereof are 2,6-di(trichloromethyl)-4-(p-methoxyphenyl)-1, 3,5-triazine, 2-trichloromethyl-5-(p-methoxystyryl)-1,3,4-oxadiazole, anthraquinone-1-sulfonyl chloride and 2,2,2-trichloroacetophenone.

(6) Amino compounds

Examples thereof are those disclosed in Journal of polymer Society, M.R. Sander et al., 1972, 10, p. 3173 and J.P. KOKAI Nos. Sho 51-82102 and Sho 52-134692. Typical examples thereof are triethylamine, triethanolamine, ethyl p-dimethylaminobenzoate, p-cyanodimethylaniline and p-formyldimethylaniline.

Other amino compounds may also be used in the invention and examples thereof are p-amino-substituted benzophenone derivatives and p-amino-substituted calcon derivatives whose specific examples include Michler's ketones, p-dimethylaminobenzylidene acetophenone and 4,4'-dimethylaminocalcon.

(7) Amino acids

One of specific examples of particularly preferred amino acids is N-phenyl glycine.

(8) Sulfur atom-containing compounds

Examples thereof are those disclosed in U.S. Pat. Nos. 2,460,105 and 2,773,822. Typical examples thereof include dibenzothiazoyl disulfide, diethylxanthogene disulfide, 2-mercaptobenzothiazole, 2-mercaptobenzimidazole and 5-methylthio-2-mercaptothiadiazole.

(9) Peroxides

Typical examples of peroxides are benzoylperoxide and 3,3', 4,4'-tetra(t-butylperoxycarbonyl)benzophenone.

(10) Pyridinium salts

Examples thereof include 1-methoxy-4-carbomethoxypyridinium tetrafluoroborate and 1-methoxy-4-phenylpyridinium tetrafluoroborate.

Other examples of these activating agents are disclosed in "Research Disclosure", Vol. 200, Item 20036, 1980, December.

Among these, particularly effective activating compounds are carbonyl compounds, sulfonyloxime compounds, acyloxime compounds, halogen atom-containing compounds, hexaarylbiimidazoles and pyridinium salts.

The photopolymerization initiators of Formula (I) can exhibit an excellent effect when they are used in combination with the foregoing sensitizers and the activating agents. In other words, the rate of polymerization of the composition of the present invention can be increased by the simultaneous addition of the foregoing sensitizers and the activating agents to the compounds of Formula (I).

The foregoing sensitizers and/or the activating agents are used in the composition in an amount ranging from 0.5 to 50% by weight and preferably 1.0 to 20% by weight on the basis of the weight of the addition polymerizable compound.

The polymerizable composition of the present invention may optionally comprise a binder, but the binder used must have compatibility to the addition polymerizable compound having an ethylenically unsaturated double bond and the photopolymerization initiator to such an extent that it does not cause any separation during processes from the preparation of a coating solution till the coating and drying of the solution, for instance, the entire processes for forming a light-sensitive layer. For instance, it must not adversely affects the development in either of dissolution development and swelling development of a light-sensitive layer or a resist layer containing the binder after imagewise exposure to light or it must form a tough film as a light-sensitive layer or a resist layer. Thus, the binder is in general selected from linear organic polymers. Specific examples thereof include polymers and copolymers as listed below.

(1) Acrylic Polymers

Examples thereof include poly(alkyl acrylates) (the alkyl group is, for instance, a methyl, ethyl, n-butyl, iso-butyl, n-hexyl or 2-ethylhexyl group); copolymers of alkyl acrylates (the alkyl groups are the same as those listed above) with at least one monomer selected from the group consisting of acrylonitrile, vinyl chloride, vinylidene chloride, styrene and butadiene; poly(alkyl methacrylates) (the alkyl group is, for instance, a methyl, ethyl, n-propyl, n-butyl, iso-butyl, n-hexyl, cyclohexyl or 2-ethylhexyl group); and copolymers of alkyl methacrylates (the alkyl groups are the same as those listed above) with at least one monomer selected from the group consisting of acrylonitrile, vinyl chloride, vinylidene chloride, styrene and butadiene.

(2) Unvulcanized rubbers, for instance, polybutadiene, polyisobutylene, polychloroprene and styrene-butadiene rubber.

(3) Vinyl polymers such as homopolymers and copolymers of vinyl acetate, vinyl alcohol and vinyl butyral.

(4) Polyethers such as polyethylene oxides.

(5) Polyesters, for instance, reaction products of polybasic acids such as phthalic acid, isophthalic acid, maleic acid and adipic acid with polyols such as ethylene glycol, 1,4butanediol, 1,6-hexanediol and neopentyl glycol.

(6) Polyurethanes, for instance, reaction products of polyisocyanates such as tolylenediisocyanate, hexamethylenedisoisocyanate, isophoronediisocyanate and diphenylmethanediisocyanate with polyols, such as 1,4-butanediol, 1,6-hexanediol, the polyether polyols as listed in the item (4) and polyester polyols obtained in the foregoing item (5).

(7) Epoxy resins.

(8) Polyamides.

(9) Other binders.

If an organic polymer soluble in water or an alkaline water is used, the resulting photopolymerizable composition can be developed with water or an alkaline water. Examples of such organic polymers are addition polymer carrying carboxyl groups on the side chains such as copolymer of methyl methacrylate and methacrylic acid, copolymer of ethyl methacrylate and methacrylic acid, copolymer of butyl methacrylate and methacrylic acid, copolymer of benzyl methacrylate and methacrylic acid, copolymer of ethyl acrylate and methacrylic acid and copolymer of methacrylic acid, styrene and methacrylic acid; copolymers of acrylic acid such as copolymer of ethyl acrylate and acrylic acid, copolymer of butyl acrylate and acrylic acid and copolymer of ethyl acrylate, styrene and acrylic acid; itaconic acid copolymers; crotonic acid copolymers; and partially esterified maleic acid copolymers.

The photopolymerizable composition of the present invention may comprise these binders in an amount ranging from 1 to 50% by weight on the basis of the weight of the addition polymerizable compound used.

The photopolymerizable composition of the present invention may further comprise optional additives such as dyes, pigments, polymerization inhibitors in addition to the foregoing components.

The photopolymerizable composition of the invention is dissolved in a proper solvent selected from the group consisting of, for instance, 2-methoxyethanol, 1-methoxy-2-propanol, 2-methoxyethyl acetate, methyl lactate, ethyl lactate, propylene glycol monomethyl ether, methanol, ethanol, methyl ethyl ketone, water and any combination thereof and then applied onto the surface of a substrate. The amount of the composition to be coated suitably ranges from about 0.1 to 10 g/m² and preferably 0.5 to 5 g/m² (weighed after drying).

The photopolymerizable composition of the present invention is preferably used as a light-sensitive layer of a presensitized plate for use in making a lithographic printing plate (hereunder referred to as "PS plate"). Examples of substrate suitable for making PS plates include aluminum plates which are subjected to a hydrophilization treatment such as silicate-treated aluminum plates, anodized aluminum plates and silicate-electrodeposited aluminum plate as well as zinc plates, stainless steel plates, copper plates subjected to a chroming treatment, hydrophilized plastic films and paper.

As a preferred example of application of the photopolymerizable composition of the present invention, there may be mentioned, for instance, a PS plate requiring no dampening water which is obtained by applying a silicone rubber layer on or below the foregoing light-sensitive layer in a thickness ranging from 0.5 to 5 μm.

The silicone rubber used herein may be those obtained by crosslinking a linear organopolysiloxane represented by the following general formula:

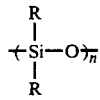

Wherein R represents an alkyl, aryl or alkenyl group or a monovalent group obtained by combining at least two of them and these groups may be substituted with at least one functional group selected from the group consisting of halogen atoms, amino groups, hydroxyl group, alkoxy groups, aryloxy groups, (meth)acryloxy groups and thiol groups. In this respect, the silicone rubber layer may further comprise other optional components such as fine powder of an inorganic substance, for instance, silica, calcium carbonate and/or titanium oxide; adhesive aids, for instance, the aforementioned silane coupling agents, titanate coupling agents and/or aluminum coupling agents; and/or photopolymerization initiators.

As starting materials for the polymers (silicone rubber) of which main chain comprises the foregoing polysiloxane, there are used, for instance, polysiloxanes having a molecular weight ranging from several thousands to several hundreds of thousands and functional groups at the ends. These polysiloxanes are crosslinked in the following manner to thus form silicone rubber layers. Specifically, the silicone rubber layer can be formed by mixing a silane crosslinking agent having the following general formula with the foregoing polysiloxane having hydroxyl groups at either or both of the ends thereof, optionally adding a catalyst, for instance, an organometal compound such as organotin compound, an inorganic acid or an amine and then hardening the polysiloxane and the silane crosslinking agent through the condensation thereof under heating or at ordinary temperature.

$$R_n SiX_{4-n}$$

wherein n is an integer ranging from 1 to 3, R is the same as that defined above, X represents a substituent such as —OH, —OR², —OAc, —O—N=CR²R³, —Cl, —Br or —I (wherein R² and R³ may be the same or different and have the same meaning as that for R defined above and Ac means an acetyl group.

The silicone rubber layer may also be obtained by hardening, through condensation, an organopolysiloxane having hydroxyl groups at the ends, a hydrogen polysiloxane crosslinking agent and an optional silane crosslinking agent.

Moreover, it is also effective to use an addition type silicone rubber layer crossliked through an addition reaction of

groups with —CH=CH— groups. The addition type silicone rubber layer has advantages in that it is not affected by humidity during hardening the same, that it can be crosslinked at a high speed and that it is easy to obtain layers having desired physical properties. In case of the condensed silicone rubber layer, insufficient hardening is often observed depending on the kinds of the crosslinking agents used if the light-sensitive layer comprises carboxylic acids, while the addition type silicone rubber layer is sufficiently hardened even if there are carboxylic acids in the light-sensitive layer. Thus, if the addition type silicone rubber layer is employed, the light-sensitive layer may comprise carboxylic acids and, therefore, the resulting light-sensitive materials can be developed with a developer comprising water or mainly comprising an alkaline water. Thus, any PS plates can easily be designed. The addition type silicone rubber layer herein used can be obtained by reacting a polyvalent hydrogen organopolysiloxane and a polysiloxane compound having at least two —CH=CH— bonds in the molecule and preferably those obtained by hardening and crosslinking a composition which comprises the following components:

(1) 100 parts by weight of an organopolysiloxane having, in the molecule, at least two alkenyl groups (preferably vinyl groups) which are directly bonded to the silicon atoms;

(2) 0.1 to 1,000 parts by weight of organohydrogenpolysiloxane having at least two

bonds in the molecule; and (3) 0.00001 to parts by weight of a catalyst for addition reaction.

In Component (1), the alkenyl groups may be present either at the ends of the molecular chain or in the middle thereof and may have organic substituents other than the alkenyl groups such as substituted or unsubstituted alkyl and/or aryl groups. Component (1) may comprise a small quantity of hydroxyl groups. Component (2) not only reacts with Component (1) to give a silicone rubber layer but also serves to increase the adhesion to the photopolymerizable light-sensitive layer. The hydrogen atom of the group

of Component (2) may be present either at the ends of the molecular chain or in the middle thereof and may have organic substituents other than hydrogen atom such as those listed above in connection with Component (1). It is preferred that not less than 60% of the organic groups of Components (1) and (2) (based on the total number of groups) be methyl groups for ensuring high ink repellency. Components (1) and (2) may have a linear, cyclic or branched molecular structure. It is preferred that the molecular weight of at least one of these components exceed 1,000 and more preferably that of Component (1) exceeds 1,000 for ensuring good physical properties of the resulting silicone rubber layer.

Examples of Component (1) include α, ω-divinylpolydimethylsiloxane and (methylvinylsiloxane)/(dimethylsiloxane) copolymers having methyl groups at both ends and examples of Component (2) are polydimethylsiloxane having hydrogen atoms at both ends, α, ω-dimethylpolymethylhydrogensiloxane, (methylhydrogensiloxane)/(dimethylsiloxane) copolymers having methyl groups at both ends and cyclic polymethylhydrogensiloxane.

Component (3) may be arbitrarily selected from those known in the art and particularly preferred are platinum compounds and specific examples thereof are elemental platinum, platinum chloride, chloroplatinic acid and olefin-coordinated platinum. It is also possible to add a crosslinking inhibitor such as a vinyl group-containing organopolysiloxane such as tetracyclo(methyl-vinyl)-siloxane, a carbon-carbon triple bond-containing alcohol, an acetone, methyl ethyl ketone, methanol, ethanol or propylene glycol monomethyl ether for the purpose of controlling the hardening speed of these compositions.

The foregoing composition causes an addition reaction as soon as they are mixed to thus start hardening. In this respect, the hardening speed is rapidly increased as the reaction temperature is raised. Therefore, the hardening of the composition is performed by maintaining it at a high temperature at which the properties of the substrate and the light-sensitive layer are not changed for a time sufficient for completely hardening the same for the purposes of extending the pot life till the composition causes crosslinking and of reducing the time required for the hardening. This in turn leads to the achievement of stable adhesion to the light-sensitive layer.

In the present invention, the silicone rubber layer serves as a printing ink repellent layer. The thickness thereof preferably ranges from 0.5 to 5 μm. This is because, if it is excessively thin, the resulting silicone rubber layer suffers from problems in that the ink repellency is reduced and that it is liable to cause defects, while if it is excessively thick, the resulting light-sensitive material has insufficient developability.

In the PS plate requiring no dampening water herein explained, a variety of silicone rubber layers may be applied onto the foregoing silicone rubber layer. In addition, an adhesive layer may be formed between the light-sensitive layer and the silicone rubber layer for the purposes of improving the adhesion between the light-sensitive layer and the silicone rubber layer and of inhibiting the poisoning of the catalyst included in the silicone rubber composition.

The present invention will hereunder be explained in more detail with reference to the following non-limitative working Examples and Preparation Examples and the effects practically achieved by the present invention will also be discussed in detail in comparison with Comparative Examples given below.

PREPARATION EXAMPLE 1

Preparation of Photopolymerization Initiator No. 4 Used in the Present Invention To a solution of 2.0 g of 5-t-butyl-1,3-benzodithiol-2thione in 100 m of methylene chloride, there was dropwise added 0.9 g of ethyl trifluoromethanesulfonate at room temperature. After allowing to stand over night, 1.0 g of 1,3-diethylthiobarbituric acid to the solution and further 3 ml of triethylamine was dropwise added thereto. After allowing to stand over night, the solvent was removed under reduced pressure. The resulting residue was recrystallized from ethanol.

Yield: 0.63 g; yellow needles having an m.p. of 185–186° C.; visible spectrum (in THF) 409 nm (ε8.63×10⁴).

Elemental Analysis
Calculated: C: 56.11%; H: 5.45%; N: 6.89%.
Found C: 56.08%; H: 5.44%; N: 7.03%.

PREPARATION EXAMPLE 2

Preparation of Photopolymerization Initiator No. 13 Used in the Present Invention A mixture of 30 g of 5-t-butyl-1,3-benzodithiol-2-thione and 60 g of diethyl sulfate was heated at 110° C. for 100 minutes. After cooling the reaction solution, 300 ml of ethanol, 18.3 g of 1,3-indanediol and then 20 ml of triethylamine were added to the solution and the resulting mixture was refluxed under heating for 30 minutes. After cooling, the crystals deposited were filtered off and recrystallized from 1000 ml of ethanol to thus give 11.1 g of yellow scaly crystals.

m.p.=239–240° C.

Electronic Spectra (in THF): λ$_{max}$ 412 nm (ε6.52×10⁴)

Elemental Analysis (for C$_{20}$H$_{16}$S$_2$O$_2$):
Calculated: C: 68.15%; H: 4.58%.
Found C: 67.85%; H: 4.57%

PREPARATION EXAMPLE 3

Preparation of Photopolymerization Initiator No. 18 Used in the Present Invention A mixture of 16.2 g of 5-t-butyl-1,3-benzodithiol-2-thione and 33 g of diethyl sulfate was heated at 110° C. for 120 minutes. After cooling the reaction solution, 100 ml of ethanol and then 11.9 g of N-methyl-4-hydroxy-2(H)-quinoline were added to the solution. Then 10 ml of triethylamine was added to the solution with stirring and the mixture was refluxed under heating on an oil bath maintained at 90° C. for one hour.

After allowing to stand over night, the crystals deposited were filtered off and recrystallized from 700 ml of ethanol to thus give 3.8 g of yellow powdery crystals.
m.p. = 188-190° C.
Electronic Spectra (in THF): $\lambda_{max}$ 411 nm ($\epsilon 5.33 \times 10^4$)
Elemental Analysis (for $C_{21}H_{19}S_2O_2N$).
Calculated: C: 66.11%; H: 5.02%; N: 3.67%.
Found C: 66.20%; H: 5.08%; N: 3.55%.

PREPARATION EXAMPLE 4

Preparation of Photopolymerization Initiator No. 19 Used in the Present Invention 6.8 g of 2-ethylthio-4-phenyl-1,3-dithiolium perchlorate and 4.0 g of 1,3-diethyl-2-thiobarbituric acid were added to 50 ml of ethanol. Further 3 ml of triethylamine was added to the resulting mixture and the mixture was refluxed under heating for 30 minutes. After allowing the solution to cool, the crystals precipitated out were filtered off and washed with ethanol to thus give 5.0 g of yellow crystals.
m.p. = 273-274 ° C.
Electronic Spectra (in THF): $\lambda_{max}$ 417 nm
Elemental Analysis (for $C_{17}H_{16}N_2O_2S_3$).
Calculated: C: 54.23%; H: 4.28%; N: 7.44%.
Found C: 54.03%; H: 4.31%; N: 7.55%.

PREPARATION EXAMPLE 5

Preparation of Photopolymerization Initiator No. 23 Used in the Present Invention A mixture of 30 g of 5-t-butyl-1,3-benzodithiol-2-thione and 60 g of diethyl sulfate was heated at 110° C. for 100 minutes. After cooling the reaction solution, 300 ml of ethanol, 20 g of 4-hydroxycoumarin and then 20 ml of triethylamine were added to the solution and the resulting mixture was refluxed under heating for 30 minutes. After cooling, the crystals deposited were filtered off and washed with ethanol to thus give 18.3 g of yellow powdery crystals
m.p. = 242-244 ° C.
Electronic Spectra (in THF): $\lambda_{max}$ 404 nm ($\epsilon 5.45 \times 10^5$)
Elemental Analysis (for $C_{20}H_{16}S_2O_3$).
Calculated C: 65.19%; H: 4.38%.
Found C: 64.88%; H: 4.38%.

EXAMPLES 1 AND 2

A photopolymerizable composition was prepared from the following components:

| | |
|---|---|
| isophoronediisocyanate (1 mole)/polyester diol of adipic acid.ethylene glycol.butanediol having a molecular weight of 2000 (0.2 mole)/butanediol (0.4 mole)/isophoronediamine (0.4 mole) polyurethane resin chain-extended with the diamine | 1.5 g |
| Adduct of xylylenediamine (1 mole)/glycidyl methacrylate (4 moles) | 0.9 g |
| polyethylene glycol diacrylate (average molecular weight of the polyethylene glycol moiety = 600) | 0.6 g |
| photopolymerization initiator (see Table 1) | 0.262 mM |
| MCF 323 (fluorine atom-containing nonionic surfactant; a 30% solution in methyl isobutyl ketone available from Dainippon Ink & Chemicals, Inc.) | 0.03 g |
| methyl ethyl ketone | 3 g |

-continued

| | |
|---|---|
| 1-methoxy-2-propanol | 21 g |

The resulting composition was applied onto the surface of a polyethylene terephthalate film having a thickness of 200 μm in an amount of 2.0 g/m² (weighed after drying) and then dried at 100° C. for one minute.

A one side-matted polypropylene film having a thickness of 9 μm was laminated with the resulting photopolymerizable light-sensitive layer so that the non-matted surface thereof was brought into contact with the light-sensitive layer.

The light-sensitive material thus obtained was exposed to light in a vacuum printing frame using Eye Rotary Printer (RP 311, available from Eye Graphics Co., Ltd., provided with a 3 KW metal halide lamp) and the exposure time (seconds) required till Curomarin Toner EOP-Y (available from Dupont Co., Ltd.) was no longer adhered to the exposed light-sensitive material was determined. The exposure times observed when the photopolymerization initiator Nos. 13 (Example 1) and 18 (Example 2) were used are summarized in the following Table 1.

TABLE 1

| Ex. No. | Photopolymerization Initiator | Weight (g) (0.262 mM) | Exposure Time (sec) Defined Above |
|---|---|---|---|
| 1 | No. 13 | 0.09 | 5 |
| 2 | No. 18 | 0.10 | 3 |

COMPARATIVE EXAMPLES 1 AND 2

The same procedures used in Examples 1 and 2 were repeated except that the following compounds were used as photopolymerization initiators to form photopolymerizable light-sensitive layers and the exposure time required till the toner was not no longer adhered to the exposed light-sensitive layers was determined. The results thus obtained are summarized in the following Table 2.

TABLE 2

| Comp. Ex. No. | Photopolymerization Initiator | Exposure Time Defined Above |
|---|---|---|
| 1 | 2-chloro-N-n-butylacridone | 15 |
| 2 | 2-chlorothioxanthone | 12 |

EXAMPLES 3 TO 5

There was prepared a photopolymerizable composition having the following composition.

| | |
|---|---|
| copolymer of benzyl methacrylate and methacrylic acid (copolymerization ratio = 73:27) | 0.5 g |
| pentaerythritol tetraacrylate | 0.5 g |
| photopolymerization initiator (see Table 3) | 0.05 mM |
| sensitizer (4,4'-bis(diethylamino)benzophenone | 0.05 mM |
| methyl ethyl ketone | 5 g |
| 1-methoxy-2-propanol | 5 g |

The resulting composition was applied onto the surface of an anodized aluminum plate in an amount of 2.0 g/m² (weighed after drying) and then dired at 100° C. for one minute.

A one side-matted polypropylene film having a thickness of 9μm was laminated with the resulting light-sensitive layer so that the non-matted side thereof was brought into contact with the light-sensitive layer.

A "Fuji PS Step Guide" (available from Fuji Photo Film Co., Ltd.) came in close contact with the light-sensitive material and the material was imagewise exposed to light for 50 seconds in a vacuum printing frame using Eye Rotary Printer (RP 311, available from Eye Graphics Co;, Ltd., provided with a 3 kW metal halide lamp).

Then the plate material was developed by immersing it in a developer having the following composition at 25° C. for one minute.

| | |
|---|---|
| 1K potassium silicate | 30 g |
| potassium hydroxide | 15 g |
| compound represented by the following formula: | 3 g |

<chemical structure: phenyl-O-phenyl with C12H25 substituent and SO3Na>

| | |
|---|---|
| water | 1000 g |

The number of steps of the remaining light-sensitive layer was determined and the results obtained are listed in Table 3 given below.

TABLE 3

| Ex. No. | Photopolymerization Initiator | Weight (g) (0.05 mM) | Number of Steps |
|---|---|---|---|
| 3 | No. 4 | 0.02 | 5 |
| 4 | No. 13 | 0.018 | 4 |
| 5 | No. 23 | 0.018 | 4 |

COMPARATIVE EXAMPLES 3 AND 4

The same procedures used in Examples 3 to 5 were repeated except that the following compound was used as a photopolymerization initiator (Comparative Example 3). On the other hand, the same procedures were repeated without using any photopolymerization initiator (Comparative Example 4). The results thus obtained are summarized in the following Table 4.

TABLE 4

| Comp. Ex. | Photoplymerization Initiator | No. of Steps |
|---|---|---|
| 3 | <chemical structure with benzothiazole, C2H5, N, S groups, CH3> | 2 |
| 4 | none | 2 |

EXAMPLE 6

An aluminum plate (JIS A 1050) having a thickness of 0.3 mm which had been degreased in the usual manner was immersed in a 1% aqueous solution of KBM 603 an amine silane coupling agent, available from Shin-Etsu Chemical Co., Ltd.) and then dried at room temperature. A solution for primer layer having the following composition was applied onto the surface of the resulting aluminum plate in an amount of 5 g/m$^2$ (weighed after drying) and then heated to 140° C. for 2 minutes to dry and harden the primer layer.

| Components | Amount (part by weight) |
|---|---|
| Sunprene IB 1700D (terminal hydroxyl group-containing thermoplastic polyurethane resin; a 30% solution in methyl ethyl ketone; available from Sanyo Chemical Industries, Ltd.) | 10 |
| Takenate D 110N (polyfunctional isocyanate compound; a 75% solution in ethyl acetate; available from Takeda Chemical Industries, Ltd.) | 0.2 |
| TiO$_2$ | 0.3 |
| MCF 323 (fluorine atom-containing nonionic surfactant; a 30% solution in methyl isobutyl ketone; available from Dainippon Ink and Chemicals, Inc.) | 0.03 |
| 1-methoxy-2-propanol | 30 |

A solution of a photopolymerizable light-sensitive composition having the following composition was applied onto the foregoing primer layer thus formed on the aluminum plate so that the coated amount thereof weighted after drying was 3 g/m$^2$ and the dried at 100° C. for one minute.

| Components | Amount (part by weight) |
|---|---|
| isophoronediisocyanate (1 mole)/polyester diol of adipic acid.ethylene glycol.butanediol having a molecular weight of 2000 (0.2 mole)/ butanediol (0.4 mole)/isophoronediamine (0.4 mole) polyurethane resin chain-extended with the diamine | 1.5 |
| Adduct of xylylenediamine (1 mole)/glycidyl methacrylate (4 moles) | 0.9 |
| polyethylene glycol diacrylate (average molecular weight of the polyethylene glycol moiety = 600) | 0.6 |
| photopolymerization initiator No. 18 | 0.13 g (0.35 mM) |
| MCF 323 (fluorine atom-containing nonionic surfactant; a 30% solution in methyl isobutyl ketone available from Dainippon Ink & Chemicals, Inc.) | 0.03 |
| methyl ethyl ketone | 3 |
| 1-methoxy-2-propanol | 21 |

Then a composition for silicone rubber layer having the following composition was applied onto the foregoing pbotopolynerizble light-sensitive layer in an amount of 2.0 g/m$^2$ weighed after drying) and dried at 140° C. for 2 minutes to give a hardened silicone rubber layer.

| Components | Amount (part by weight) |
|---|---|
| α, ω-divinylpolydimethylsiloxane (degree of polymerization = about 700) | 9 |
| compound of the following formula: | 1 |

$$CH_3-\underset{\underset{CH_3}{|}}{\overset{\overset{CH_3}{|}}{Si}}-O(\underset{\underset{CH_3}{|}}{\overset{\overset{CH_3}{|}}{SiO}})_{30}(\underset{\underset{H}{|}}{\overset{\overset{CH_3}{|}}{SiO}})_{10}\underset{\underset{CH_3}{|}}{\overset{\overset{CH_3}{|}}{Si}}-CH_3$$

| | |
|---|---|
| compound of the following formula: | 0.2 |

$$[CH_2\overset{\diagdown}{\underset{O}{\diagup}}CHCH_2OC_3H_6(CH_3)SiO](SiO)_3$$

-continued

| Components | Amount (part by weight) |
|---|---|
| polydimethylsiloxane (degree of polymerization = about 8,000) | 0.5 |
| olefin-chloroplatinic acid | 0.2 |
| crosslinking-inhibitory agent | 0.15 |
| Isopar G (available from Esso Chemical Co., Ltd.) | 140 |

A one side-matted biaxially oriented polypropylene film having a thickness of 9 μm (oxygen permeability: 5,000 cc/m² /24 hr./atm at 20° C.) was laminated with the silicone rubber layer thus obtained so that the non-matted side thereof came in contact with the silicone rubber layer to thus give a PS plate requiring no dampening water.

"Fuji Step Guide" was superimposed to the resulting PS plate and exposed to light in vacuo for 10 seconds using Eye Rotary Printer. After the exposure to light, the laminate film was peeled off, the plate was immersed in a solution of tripropylene glycol maintained at 40°C. for one minute and rubbed with a developing pad in water to remove the silicone rubber layer on the non-exposed portions and to thus give a lithographic printing plate requiring no dampening water. The maximum number of the step guide of the portion to which the silicone rubber layer was photoadhered was found to be 8 steps when the compound No. 18 was used as a photopolymerization initiator.

COMPARATIVE EXAMPLES 5 AND 6

The same procedures used in Examle 6 were repeated except that a photoplymerization initiator listed in Table 5 was used to obtain PS plates requiring no dampening water and the plates were likewise evaluated. The results obtained are listed in the following Table 5.

TABLE 5

| Comp. Ex. | Photopolymerization Initiator | Max. No. of Steps |
|---|---|---|
| 5 | compound of the following formula: 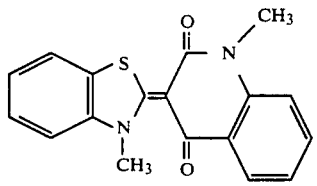 | 4 |
| 6 | 2-chloro-N-n-butylacrydone | 6 |

What is claimed is:
1. A photopolymerizable composition which comprises an addition polymerizable compound having at least one ethyenically unsaturated double bond and a photopolymerization initiator, wherein it comprise a compound represented by the following general formula (I) as the photopolymerization initiator:

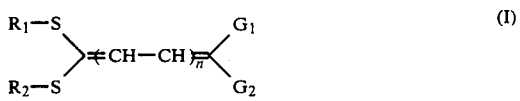

(wherein $R_1$ and $R_2$ may be the same or different and each independently represents a substituted or unsubstituted alkyl, aryl or alkenyl group or $R_1 R_2$ may form a non-metallic ring together with the sulfur atoms to which they are bonded; n is 0, 1 or 2 ; $G_1$ and $G_2$ may be the same or different and each represents a hydrogen atom, a cyano group or a substituted or unsubstituted alkoxycarbonyl, aryloxycarbonyl, acyl, arylcarbonyl, alkylthio, arylthio, alkylsulfonyl, arylsulfonyl or fluoroalkylsulfonyl group, provided that $G_1$ and $G_2$ do not simultaneously represent hydrogen atoms or $G_1$ and $G_2$ may form a non-metallic ring together with the carbon atom to which they are bonded).

2. The photopolymerizable composition of claim 1 wherein the addition polymerizable compound having an ethylenically unsaturated double bond is a compound which has at least one ethylenically unsaturated double bond in the chemical structure and which is a monomer, prepolymer, a mixture thereof or a copolymer thereof having a boiling point of not less than 100° C. and an acryloyl or methacryloyl group.

3. The photopolymerizable composition of claim 1 wherein the addition polymerizable compound having an ethylenically unsaturated double bond is at least one member selected from the group consisting of acrylates or methacrylates of methanol, ethanol, propanol, hexanol, octanol, cyclohexanol, ethylene glycol, propylene glycol, diethylene glycol, triethylene glycol, tetraethylene glycol, polyethylene glycol, glycerin, trimethylolpropane and pentaerythritol; reaction products of methylamine, ethylamine, butylamine, benzylamine, ethylenediamine, diethylenetriamine, hexamethylenediamine, p-xylylenediamine, m-xylylenediamine, ethanolamine, dimethylamine or aniline, or acetic acid, propionic acid, benzoic acid, acrylic acid, methacrylic acid, succinic acid, maleic acid, phthalic acid, tartaic acid or citric acid with glycidyl acrylates or glycidyl methacrylates; acrylamide, methacrylamide, N-methylolacrylamide, methylenebisacrylamide and diacetoneacrylamide; reaction products of epoxy compounds with acrylic acid or methacrylic acid; reaction products of isocyanate-containing compounds with β-hydroxyethyl acrylate or β-hydroxyethyl methacrylate.

4. The photopolymeriazble composition of claim 1 wherein the general formula (I), $R_1$ and $R_2$ each represents an alkyl group, the alkyl group is selected from those having 1 to 10 carbon atoms and the alkyl group may be substituted with a substituent selected from a hydroxyl group, a cyano group, an alkoxy group, a halogen atom, a carboxyl group, a carboalkoxy group, a sulfonyl group, an aryl group, a vinyl group, a methylvinyl group and/or a cinnamyl group.

5. The photopolymerizable composition of claim 1 wherein in the general formula (I), $R_1$ and $R_2$ each represents an aryl group, the aryl group is a phenyl or naphthyl group and the aryl group may be substituted with a substituent selected from the group consisting of alkyl groups having 1 to 10 carbon atoms, hydroxyl group, cyano groups, alkoxy groups having 1 to 10 carbon atoms, halogen atoms, carboxyl groups, carboalkoxy groups and sulfonyl groups.

6. The photopolymerizable composition of claim 1 wherein in the general formula (I), $R_1$ and $R_2$ each represents an alkenyl group, it is a vinyl group, it may be substituted with a substituent selected from the group consisting of alkyl groups having 1 to 10 carbon atoms and aryl groups having 6 to 18 carbon atoms, and these substituents may be substituted with an alkyl group having 1 to 10 carbon atoms.

7. The photopolymerizable composition of claim 1 wherein the general formula (I), $R_1$ and $R_2$ form a ring comprising non-metallic elements together with the sulfur atoms to which they are bonded.

8. The photopolymerizable composition of claim 7 wherein the ring is a member selected from the group consisting of 5-membered or 6-membered rings, or 5-membered or 6-membered rings obtained by condensing aromatic rings and the ring may have a substituent selected from the group consisting of alkyl groups, aryl groups, substituted alkyl and aryl groups, hydroxyl group, cyano groups, alkoxy groups, halogen atoms, carboxyl groups, carboalkoxy groups and sulfonyl groups.

9. The photopolymerizable composition of claim 1 wherein in the general formula (I), the alkyl moiety of the alkoxycarbonyl, acyl, alkylthio, alkylsulfonyl or fluoroalkylsulfonyl groups in the foregoing substituents $G_1$ and $G_2$ is an alkyl group having 1 to 10 carbon atoms, the aryl moiety of the aryloxycarbonyl, arylcarbonyl, arylthio, arylsulfonyl of $G_1$ and $G_2$ is a phenyl or naphthyl group and these alkyl and aryl moieties may be substituted with at least one member selected from the group consisting of alkyl groups having 1 to 10 carbon atoms, hydroxyl group, cyano groups, alkoxy groups having 1 to 10 carbon atoms, halogen atoms, carboxyl groups, carboalkoxy groups, sulfonyl groups, sulfoalkoxy groups, aryl groups having 6 to 18 carbon atoms, acyl groups, vinyl group and cinnamyl groups.

10. The photopolymerizable composition of claim 1 wherein in the general formula (I), the non-metallic ring formed from $G_1$ and $G_2$ together with the carbon atom to which they are bonded is a member selected from the group consisting of 1,3-dicarbonyl nuclei, pyrazolinone nuclei, isooxazolinone nuclei, oxyindole nuclei, 2,4,6-triketohexahydropyrimidine nuclei, 2-thio-2,4-thiazolidinedione nuclei, 2-thio-2,4-oxazolidinedione nuclei, thianaphthenone nuclei, 2-thio-2,5-thiazolidinedione nuclei, 2,4-thiazolidinedione nuclei, thiazolidinone nuclei, 4thiazolinone nuclei, 2-imino-2-oxozolin-4-one nuclei, 2,4-imidazolidinedione nuclei, 2-thio-2,4-imidazolidinedione nuclei, 2-imidazolin-5-one nuclei, furan-5-one nucleus, 4-hydroxy-2(1H)-quinolinone nuclei or 4-hydroxy-2(1H)-pyridinone nuclei, substituted and unsubstituted 4-hydroxy-2H-pyran-2-one and 4-hydroxycoumarin nuclei, substituted and unsubstituted thioindoxyl nuclei.

11. The photopolymerizable composition of claim 1 wherein if $R_1$ $R_2$ do not form a ring or they form a saturated heterocyclic ring, the photopolynerization initiator is one prepared according to the following reaction scheme:

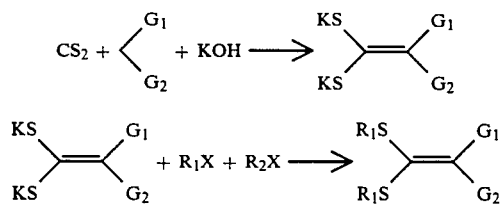

(wherein X represents a halogen atom).

12. The photopolymerizable composition of claim 1 wherein the photopolymerization initiator represented by the foregoing general formula (I) wherein $R_1$ $R_2$ form an unsaturated heterocyclic ring is one prepared by the following method:

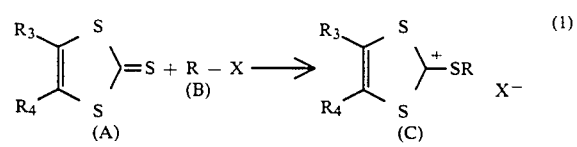

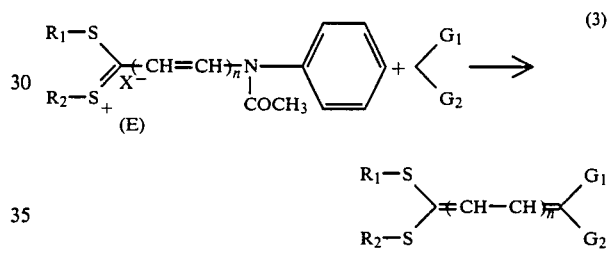

(wherein $R_3$ and $R_4$ each independently represents a hydrogen or halogen atom or an alkyl, aryl, substituted alkyl, substituted aryl, hydroxyl, cyano, alkoxy, carboxyl or alkoxycarbonyl group, or $R_3$ and $R_4$ may be bonded together to form a heterocyclic ring or a condensed aromatic ring).

13. The pphotopolymerizable composition of claim 1 wherein the photopolyerization initiator represented by the general formula (I) wherein n=1, 2 is one prepared by reacting a compound represented by the following general formula (E) with a compound of Formula (D) in a proper solvent in the presence of a catalyst:

$$R_1-S \atop R_2-S_+ \!\!\!\!\!\!\!\!\!\!\!\!\!\!\!\!\!\!\!\!\!\!\!\!\!\!\!\!\!\!\!\!\!\!\!\!\!\!\!\!\! \diagdown\!\!\!\!\diagup \!\!(CH=CH)_n\!\!-\!\!N\!\!-\!\!\!\!\!\!\!\!\!\!\!\!\!\!\!\!\!\!\!\!\!\!\!\!\!\!\!\!\!\!\!\!\!\!\!\!\!\!\!\!\! \bigcirc \!\!\!\!\!\!\!\!\!\!\!\!\!\!\!\!\!\!\!\!\!\!\!\!\!\!\!\!\!\!\!\!\!\!\!\!\!\!\!\!\! + \!\!\!\!\!\!\! \diagup\!\!\!\!\!\!G_1 \atop G_2 \;\;\;\longrightarrow$$

(E)    COCH$_3$ (wherein $X^{1-}$ represents an anion, n is an integer of 1 or 2 $R^1$, $R^2$, $G^1$ and $G^2$ are the same as those defined above in connection with Formula (I)).

14. The photopolymerizable composition of claim 1 wherein the amount of the photopolymerization initiator used ranges from 0.5 to 50% by weight on the basis of the weight of the addition polymerizable compound used.

15. The photopolymerizable composition of claim 14 wherein the amount of the photopolymerization initiator used ranges from 1.0 to 20% by weight on the basis of the weight of the addition polymerizable compound used.

16. The photopolymerizable composition of claim 1 wherein it further comprises a sensitizer.

17. The photopolymerizable composition of claim 16 wherein the sensitizer is at least one member selected from the qroup consisting of benzophenone derivatives, benzanthrone derivatives, quinones, anthraquinones, aromatic nitro compounds, naphthothiazoline derivatives, benzothiazoline derivatives, xanthones, naphthothiazole derivatives, ketocoumarin compounds, benzothiazole derivatives, naphthofuranone compounds, benzoin compounds, acetophenone compounds, fluorenone compounds, pyrylium salts and thiapyrylium salts.

18. The photopolymerizable composition of claim 16 wherein it further comprises at least one activating agent selected from the group consisting of carbonyl compounds, sulfonyloxime compounds, acyloxime compounds, hexaarylbiimidazole compounds, halogen atom-containing compounds, amino compounds, amino acids, sulfur atom-containing compounds, peroxides, pyridinium salts.

19. The photoplymerizable composition of claim 18 wherein the sensitizer and/or the activating agent are used in the composition in an amount ranging from 1.0 to 20% by weight on the basis of the weight of the addition polymerizable compound.

20. The photoplymerizable composition of claim 1 wherein it further comprises a binder selected from the group consisting of acrylic polymers, unvulcanized rubbers, vinyl polymers, polyethers, polyesters, polyerethanes, epoxy resins and polyamides and the amount of the binder ranges from 1 to 50% by weight on the basis of the weight of the addition polymerizable compound used.

* * * * *